US010410882B2

(12) United States Patent
Gandhi et al.

(10) Patent No.: US 10,410,882 B2
(45) Date of Patent: Sep. 10, 2019

(54) SOLDER BOND SITE INCLUDING AN OPENING WITH DISCONTINUOUS PROFILE

(71) Applicant: Micron Technology, Inc., Boise, ID (US)

(72) Inventors: Jaspreet S. Gandhi, Milpitas, CA (US); Dale Arnold, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/847,687

(22) Filed: Dec. 19, 2017

(65) Prior Publication Data
US 2019/0074194 A1 Mar. 7, 2019

Related U.S. Application Data

(62) Division of application No. 14/798,261, filed on Jul. 13, 2015, now Pat. No. 9,881,858.

(51) Int. Cl.
H01L 21/48 (2006.01)
H01L 23/498 (2006.01)
C23C 18/32 (2006.01)
H01L 23/00 (2006.01)

(52) U.S. Cl.
CPC .......... H01L 21/4846 (2013.01); C23C 18/32 (2013.01); H01L 21/481 (2013.01); H01L 21/4853 (2013.01); H01L 23/49811 (2013.01); H01L 23/49838 (2013.01); H01L 23/49894 (2013.01); H01L 24/16 (2013.01); H01L 24/13 (2013.01); H01L 2224/13025 (2013.01); H01L 2224/16227 (2013.01); H01L 2224/16237 (2013.01)

(58) Field of Classification Search
CPC .... A61K 36/736; A61K 45/06; A61K 9/0014; A61K 9/06; A61K 9/107; H05K 2203/0597; H01K 2201/0989; H01K 21/4846; H01L 21/481; H01L 21/4846; H01L 21/4853; H01L 2224/13025; H01L 2224/16227; H01L 224/16237; H01L 23/49811; H01L 23/49838; H01L 23/49894; H01L 24/13; H01L 2224/16237; H01L 24/16
USPC .......................... 216/13, 14, 17, 18, 19, 20
See application file for complete search history.

(56) References Cited

U.S. PATENT DOCUMENTS

| 6,228,466 | B1 |  | 5/2001 | Tsukada et al. |
| 8,119,531 | B1 | * | 2/2012 | Arnold ............... H01L 21/0337 257/E21.258 |
| 9,881,858 | B2 |  | 1/2018 | Gandi et al. |
| 2006/0244140 | A1 |  | 11/2006 | Hu |
| 2007/0023918 | A1 | * | 2/2007 | Kuechenmeister ..... H01L 24/03 257/774 |
| 2007/0262463 | A1 | * | 11/2007 | Akram ................ G01R 1/0483 257/774 |

(Continued)

Primary Examiner — Lan Vinh
(74) Attorney, Agent, or Firm — Dorsey & Whitney LLP

(57) ABSTRACT

Apparatuses and methods for formation of a bond site including an opening with a discontinuous profile are disclosed herein. An example apparatus may at least include a substrate, a contact on the substrate, and a mask layer formed on the substrate and at least a portion of the contact. The mask layer may also include an opening formed therein, with the opening having a discontinuous profile from a top surface of the mask layer to the contact.

20 Claims, 5 Drawing Sheets

(56) References Cited

U.S. PATENT DOCUMENTS

| | | | |
|---|---|---|---|
| 2009/0027864 A1 | 1/2009 | Cho et al. | |
| 2011/0300705 A1* | 12/2011 | Yang | H01L 24/03 |
| | | | 438/613 |
| 2014/0037862 A1 | 2/2014 | Lee et al. | |
| 2014/0312512 A1* | 10/2014 | Choi | H01L 21/4846 |
| | | | 257/779 |
| 2015/0223332 A1 | 8/2015 | Nishida et al. | |
| 2015/0311170 A1* | 10/2015 | Arvin | H01L 24/11 |
| | | | 438/614 |
| 2017/0018489 A1 | 1/2017 | Gandhi et al. | |

* cited by examiner

SOLDER BOND SITE INCLUDING AN OPENING WITH DISCONTINUOUS PROFILE

CROSS REFERENCE TO RELATED APPLICATION(S)

This application is a divisional of U.S. patent application Ser. No. 14/798,261 filed Jul. 13, 2015 and issued as U.S. Pat. No. 9,881,858 on Jan. 30, 2018. The aforementioned application, and issued patent, is incorporated herein by reference, in its entirety, for any purpose.

BACKGROUND

In the semiconductor industry, solder balls may be used to electrically couple components of an electronic system. For example, solder balls may be formed on two components intended to be electrically coupled to form a packaged end product. This process may conventionally include forming solder bonds through intimate contact of two or more solder balls from the two components. A subsequent heating step may be performed to assist with forming a solder contact between the two components. The process of joining and heating the solder balls, however, may occasionally result in incomplete solder contacts, which may be the result of defects occurring during the process.

Semiconductor packaging substrates may include metallic traces and connection locations for providing electrical connections between a semiconductor chip and a printed circuit board. The metallic connection locations may have a solder ball formed thereon to provide a bonding location for a solder ball of a semiconductor chip. The solder may be used to form a low temperature electrical connection between the semiconductor chip and the metallic traces on the substrate. Due to the defects and missed solder contacts that may result in the solder ball to solder ball contact formation, it may be helpful to omit one or more of the solder balls from the bonding process. Omitting the solder ball from one of the components, however, may have unintended consequences resulting in subsequent packaging problems. As such, packaging substrates and methods of forming the same to address both types of problems (solder ball to solder ball contact defects and the unintended consequences of eliminating one of the solder balls) may be highly desired.

DETAILED DESCRIPTION

Apparatuses including a bond site including an opening with a discontinuous profile, and methods for forming the same, are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
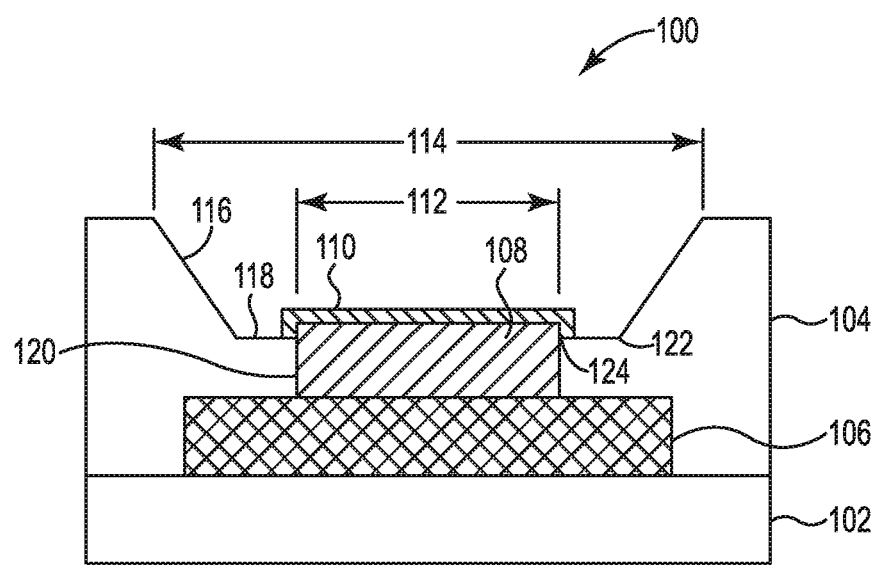
FIG. 1 is an illustration of a bond site according to the present disclosure.

FIG. 1 is an illustration of a bond site 100 according to the present disclosure. The bond site 100 may be used for forming electrical connections between two components of a device, such as a packaging substrate and a semiconductor-based integrated circuit. For example, the packaging substrate may be configured to receive a semiconductor memory chip and electrically couple to the memory chip at one or more bond sites 100. In some embodiments, there may be a great number of bond sites 100 on a packaging substrate. The bond site 100 may include a substrate 102, a solder mask 104, a contact 106, a first metal layer 108, and a second metal layer 110.

The substrate 102 may be a packaging substrate for semiconductor packaging. The substrate 102 may be formed from or include a combination of organic materials, e.g., resins, glass fibers, etc., and may be non-conductive. In some embodiments, the substrate 102 may include multiple layers of electrical traces, through-hole vias for electrical connections between the various layers of electrical traces, which may terminate at one or more of the contacts 106. The contact 106 may also be a bond pad associated with one or more electrical traces included with the substrate 102. For example, the substrate 102 may include four layers of electrical traces (note shown in FIG. 1) patterned at various layers of the substrate 102 with connections between one or more layers of the electrical traces. The substrate 102 may be formed by an additive fabrication process. For example, the substrate 102 may start as a single layer of material and a patterned, first layer of electrical traces formed on one side. A second layer of organic material may then be formed on top of the electrical traces and through-hole vias formed in the second layer of organic material so that electrical connections may be made to some of the first layer of electrical traces. This process may be repeated until a desired number of trace layers are formed. A final layer of electrical trace layer and contacts may be a finishing layer. The substrate 102 may then be ready to receive a semiconductor die.

The solder mask 104, which may formed from organic materials, may be formed over the substrate 102 and the contact 106. Additionally, the materials from which the solder mask 104 is formed may resist adherence of metals, which may ease subsequent fabrication steps. The solder mask 104 may be included to prevent inadvertent contact with one or more contacts and/or electrical traces on the substrate 102. The solder mask 104 may be patterned and etched to form openings therein, such as openings 112 and 114. The openings may provide access to the contact 106, and/or allow for further process steps.

The contact 106 may be formed on the substrate 102 and patterned into long lines and/or contact locations, e.g., pedestals or bond pads, for subsequent formation of electrical connections. The contact 106 may be a recessed contact with respect to a top surface of the solder mask 104, for example. The contact 106 may be formed from a conductive material, and may include one or metals, semiconductive materials, or combinations thereof. For example, the contact 106 may be formed from copper.

One or more metal layers may be formed, deposited for example, on the contact 106. The one or more metal layers may provide a surface that promotes metallic bonding at temperatures and/or pressures suitable for the materials of the bond site 100. For example, the one or more metal layers may at least include a nickel layer and a gold layer. The nickel layer may act as a barrier layer to reduce metal migration, and the gold layer may provide an oxide-free, metallic-bond promoting layer. In some embodiments, fewer or greater numbers of metal layers may be formed on the contact 106. For example, in some embodiments a palladium layer may be included in the one or more metal layers formed on the contact 106. In embodiments that include a palladium layer, the palladium layer may be disposed between first and second metal layers, such as the first metal layer 108 and the second metal layer 110.

The first metal layer 108 may be formed on the contact 106 and formed in the opening 112 of the solder mask 104. The first metal layer 108 may be formed using a metal plating process, such as an electroless plating process. For example, the first metal layer 108 may be formed from electroless nickel. While nickel is given as an example, those skilled in the art would recognize other suitable metals may be used as well. It may be desirable for the first metal layer 108 to have a thickness such that a surface of the first metal layer is flush with or rises just above the step 118 of the solder mask 104.

The second metal layer 110 may be formed on the first metal layer 108. The second metal layer 110 may be thinner than the first metal layer 108. The second metal layer 110 may also be formed using a plating process. For example, the second metal layer 110 may be gold, which may be formed using an immersion gold process. The second metal layer 110 may completely cover the first metal 108 and may provide an oxidation resistant surface to assist with subsequent fabrication steps, such as solder bond formation.

The opening or openings of the solder mask 104 may be defined by a side profile that allows for unobstructed access to electrically connect with the contact 106 and first and second metal layers disposed in the bottom of the openings 112, 114 of the solder mask 104. The profile of the opening or openings of the solder mask 104 may be a discontinuous procession of side walls, e.g., surfaces, extending from a top surface of the solder mask 104 to a surface of the contact 106. For example, the side wall 116 may extend at an angle from the top surface of the solder mask 104 to the step 118. For example, the sidewall 116 may be beveled at an angle that is less than normal to the top surface of the solder mask 104. For example, the angle may be at 30, 45, or 60 degrees from normal. Further, the side wall 116 may terminate at an edge 122 of the step 118, which may be where the sidewall 116 and the edge 118 join. The step 118 may extend inward toward the opening 112 before terminating at an edge 124. The edge 124 may be where the step 118 and the sidewall 120 join. The sidewall 120 may extend from the edge 124 and terminate at the contact 106. An angle of the sidewall 120 may be different than an angle of the sidewall 116. For example, an angle of the sidewall 120 may be normal to the top surface of the solder mask 104 and/or the contact 106.

The step 118 may be recessed with respect to the top surface of the solder mask 104. The step 118 may form an annulus and a discontinuous interface between the sidewall 116 and the sidewall 120. As such, the sidewall 116 may be set back from the sidewall 120. Further, the step 118 may terminate/begin at the edges 122 and 124. For example, an outer edge of the step 118 may be the edge 122, while an inner edge of the step 118 may be the edge 124. The edges may be locations where the sidewalls 116 and 120 join the step 118. The edges 122 and 124 may further define the discontinuous profile of the openings 112 and 114.

Further, the discontinuous profile may define an opening or openings in the solder mask 104. The sidewall 116 may define the opening 114 and the sidewall 120 may define the opening 112. The two openings 112, 114 may combine to provide a single opening and access to the contact 106. The opening 114 may have a larger diameter than the opening 112, and may decrease in diameter from the top surface of the solder mask 104 to the step 118. For example, the opening 114 may have a larger diameter at the top surface of the solder mask 104 and a smaller diameter at the outer edge 122 of the step 118. The opening 112 may be recessed from a top surface of the solder mask 104. For example the opening 112 may be located at the bottom of the opening 114, as depicted in FIG. 1, and begin at the edge 124 of the step 118.

Figure 3:
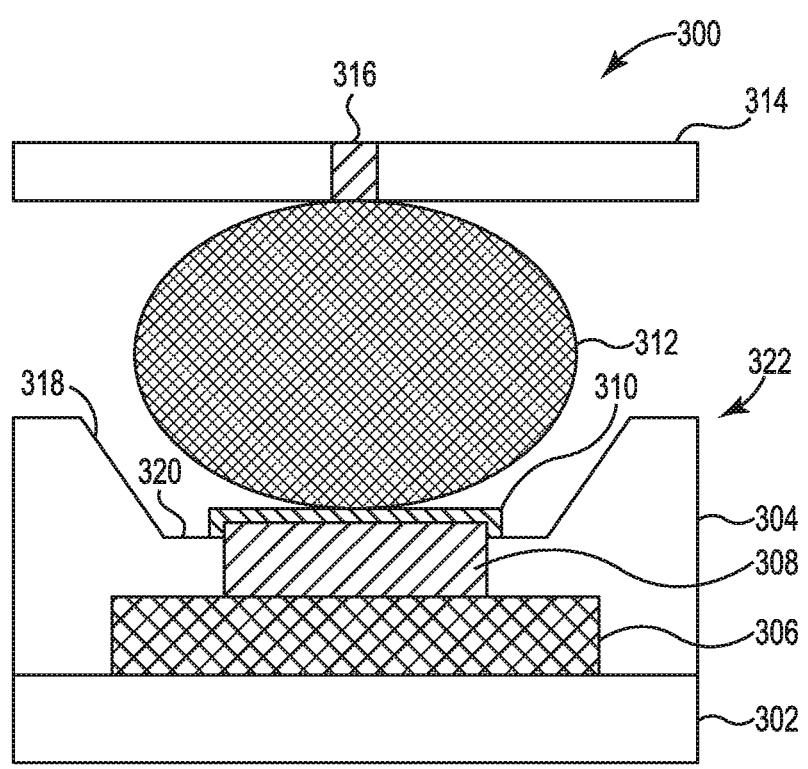
FIG. 3 is a solder ball bond site arrangement in accordance with the present disclosure.

The bond site 100 may allow for solder bonds to be formed between the contact 106 and a semiconductor chip with a solder ball, for example, (as shown in FIG. 3) without the solder mask 104 interfering with the bonding process. This lack of or reduced interference may be due to the discontinuous profile and the relative sizes of the openings 112 and 114, for example.

FIGS. 2A-2G are cross-sectional depictions of a process sequence 200 to form a bond site in accordance with the present disclosure. The process sequence 200 provides example cross-sectional illustrations of a substrate progressing through a sequence of fabrication steps, which, for example, may result in the bonding site 100 of FIG. 1. The fabrication steps and the associated processes discussed below provide an example fabrication sequence, but should not be considered limiting to the present disclosure.

Figure 2A:
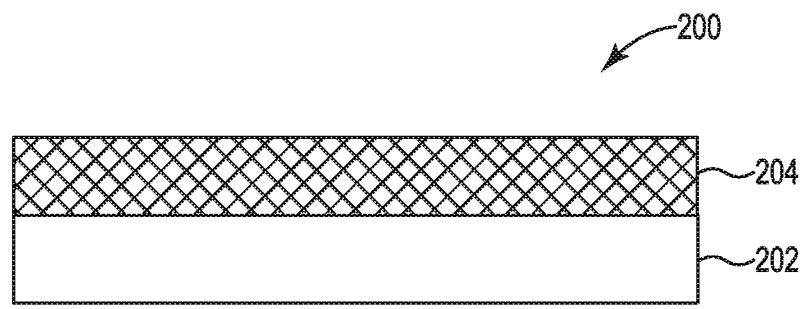
FIGS. 2A through 2G are cross-sectional depictions of a process sequence to form a bond site in accordance with the present disclosure.

FIG. 2A shows a substrate 202 with a top layer 204. The substrate 202 may be a semiconductor package substrate, and the top layer 204 may be a metal. In some embodiments, the substrate 202 may be the substrate 102 of FIG. 1, and the top layer 204 may be used to form the contact 106 of FIG. 1. The substrate 202 may be formed from organic materials, such as resins and glass fibers. The top layer 204 may be formed on the substrate 202 by any known technique in the art. The top layer 204, for example, may be copper.

Figure 2B:
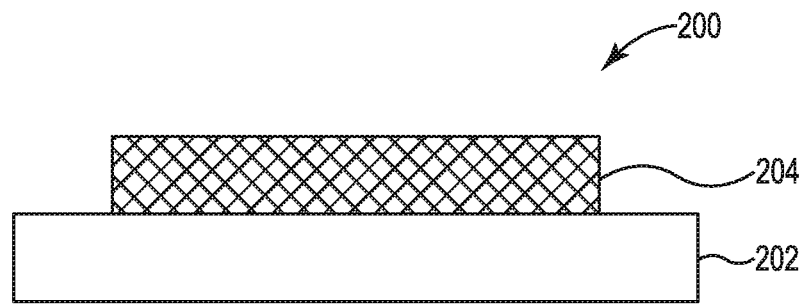

FIG. 2B shows the substrate 202 and top layer 204 following one or more processing steps. For example, the top layer 204 may be formed into the pedestal shape shown in FIG. 2B by removing portions of the top layer 204. The portions of the top layer may be removed by using, for example, masking and etching processes. The top layer 204 is depicted as a rectangular pedestal, but any shape falls within the bounds of the disclosure. Further, the top layer 204 may extend outward in one or more directions to form or include electrical traces (not shown) on the substrate 202. In some embodiments, the substrate 202 may include a large number of pedestal shape top layers, which may be used for electrical contacts.

Figure 2C:
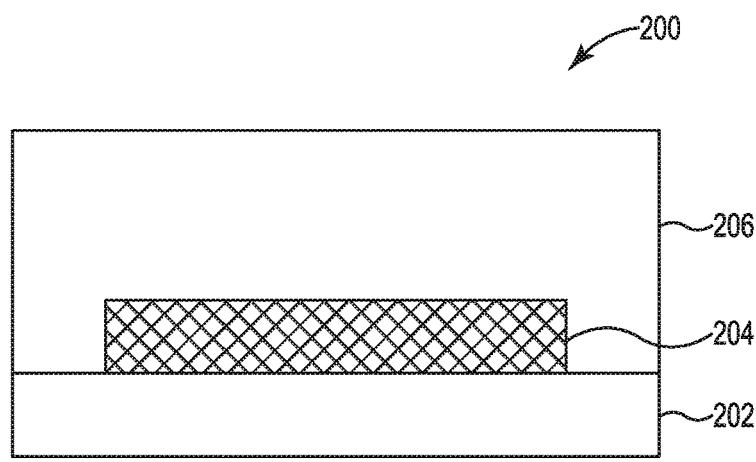
Figure 2D:
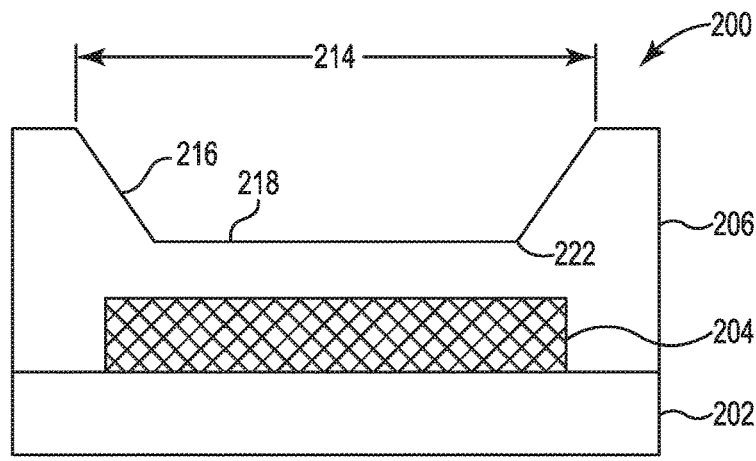
Figure 2E:
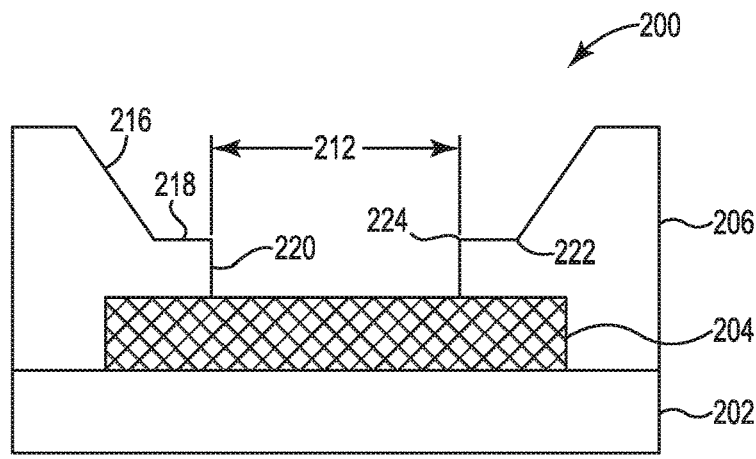

FIGS. 2C through 2E show the formation and subsequent processing of the solder mask 206, which may be used for the solder mask 104 of FIG. 1. The solder mask 206 may be formed on the substrate 202 and formed over the top layer 204, as shown in FIG. 2C. A profile of the openings 212 and 214 in the solder mask 206, as shown in FIG. 2E, may be formed by any means known in the art. The profile may be defined by sidewall 216, step 218, and sidewall 220, which may further define the openings 212 and 214 in the solder mask 206. In some embodiments, the two openings 212, 214 may form a single opening that allows for access to the top layer 204, which may be recessed from a top surface of the solder mask 206. Any fabrication process known in the art may be used to form the solder mask 206 as shown in FIG.

2C. For example, a two-step removal process may be used to form the openings 214 and 212, respectively, which may also result in the formation of the sidewall 216, step 218, and sidewall 220. For example, a two-step masking and etching process may be used. A first etch pattern may be formed on the solder mask 206 of FIG. 2C and the solder mask 206 is etched to form the opening 214, which may result in the formation of sidewall 216, step 218, and edge 222 as depicted in FIG. 2D. The angle of the sidewall 216 may be dependent upon the etch process used in forming the opening 214, and it may be desirable in some embodiments for the angle to be less than normal to the top surface of the solder mask 206. The opening 214 may also be formed so that a diameter of the opening at the top surface of the solder mask 206 is larger than a diameter at the edge 222. The edge 222 may be an edge, e.g., an outer edge, of the step 218, and may also be where the sidewall 216 and the step 218 join. Thus, as depicted in FIG. 2D, the formation of the opening 214 may result in the angled sidewall 216 that angles inward from the top surface of the solder mask 206 to the edge 222, and the step 218.

A second pattern and etch step may then be performed, which may result in the formation of opening 212, and which may result in the formation of sidewall 220, and edge 224. The second pattern and etch step may be performed on the solder mask 206 as depicted in FIG. 2D, which may result as the depiction of FIG. 2E. The second etch process may form the sidewall 220 at an angle approximately normal to the top surface of the solder mask 206 and/or the contact 204. The edge 224 may be an inner edge of the step 218, and may also be where step 218 and sidewall 220 join. FIG. 2E shows the solder mask 206 with the openings 212 and 214 formed therein and defined by the discontinuous profile defined by sidewalls 216, 220 and step 218.

Alternatively, a single masking and etching process may be used to simultaneously form an opening, such as the openings 212 and 214. For example, a process known as a "leaky chrome" process may be used. The "leaky chrome" process may use a mask, e.g., a reticle, having an opaque gradient mask region that may transmit a portion of incident radiation during exposure such that a gradient in the intensity received may be created. Such a process may be used to form the openings 212 and 214 (and the sidewalls 216, 220 and step 218) using the single masking and etching process.

Figure 2F:
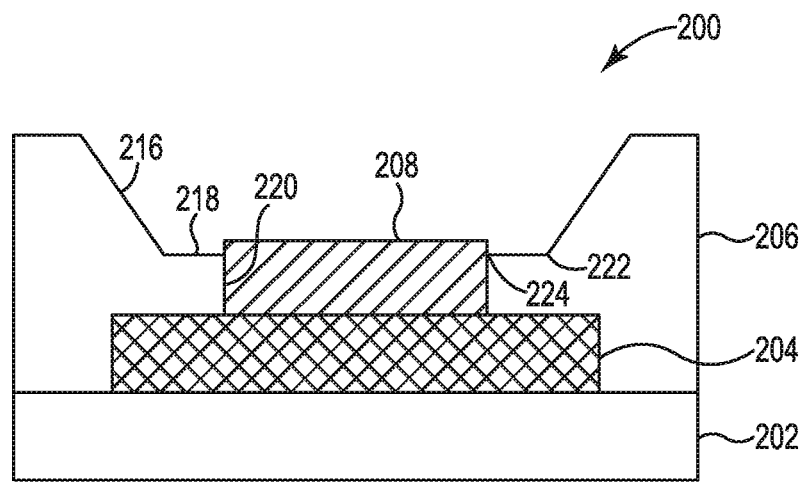
Figure 2G:
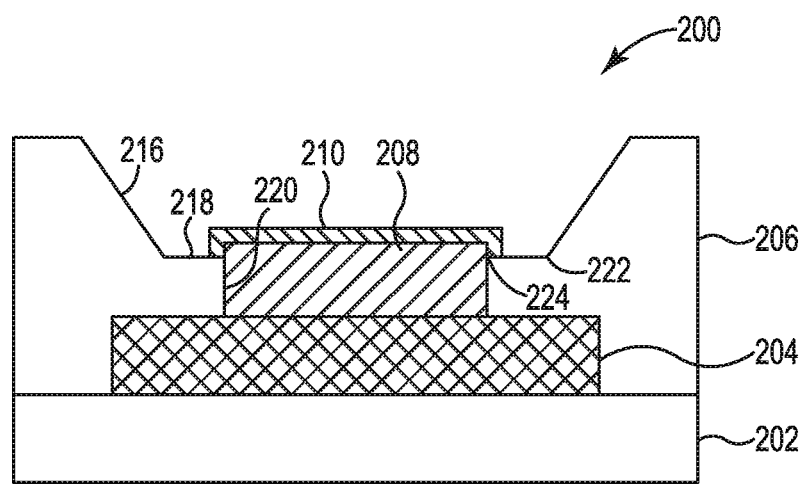

FIGS. 2F and 2G show the formation of first and second metal layers 208 and 210. FIG. 2F shows post fabrication result of the formation of the first metal layer 208. The first metal layer 208 may be formed having a thickness to provide an upper surface of the first metal layer 208 to be at least flush with the top of the step 218. The first metal layer 208, which may be nickel, may be formed by an electroless plating process. For example, an electroless nickel plating process may be used to form the first metal layer 208. In embodiments that form the first metal layer 208 using an electroless plating process, the thickness of the first metal layer 208 may be time based as long as the other plating parameters are constant, e.g., process bath circulation, temperature, and composition. The second metal layer 210 is depicted in FIG. 2G. The second metal layer 210 may be formed to have a thickness to ensure there are no pin holes in the second metal layer 210, and to provide enough material to promote adhesion of subsequent metallic bonds formed with at least the second metal layer 210. The second metal layer 210 may be gold, for example, and formed by a gold immersion plating process.

In embodiments where the solder mask 206 is formed from or includes an organic material, e.g., a resin-based material, the formation of the first and second metal layers 208, 210 may only plate the exposed areas of the top layer 204. As such, one or more masking steps may be avoided.

The sequence of process steps 200 provides an example process flow for forming a bond site, such as the bond site 100 of FIG. 1. The sequence of steps and the associated processes may be selected to produce a solder mask having an opening or openings characterized by a discontinuous profile as defined by sidewalls 216, 220, and the step 218. At least the opening 214 as defined by the sidewall 216 and the step 218 may provide unobstructed access to the bottom of the solder mask 204 so that contact may be made with the top layer 204.

FIG. 3 is a solder ball bond site arrangement 300 in accordance with the present disclosure. The arrangement 300 may include a bond site 322, a solder ball 312, and a semiconductor chip 314. The arrangement 300 depicts the bond site 322, solder ball 312, and the semiconductor chip 314 prior to bond formation, but after the bond site 322, solder ball 312, and the semiconductor chip 314 have been positioned so that a metallic bond may be formed between the solder ball 312 and the first and/or second metal layers 308, 310. FIG. 3 further shows the profile of the opening in the solder mask 304, which allows for intimate contact between a solder ball 312 with the second metal layer 310 without the solder mask 304 obstructing contact between the solder ball 312 and the second metal layer 310. At least the opening in the bond site 322 as defined by sidewall 318 and step 320 may allow for unobstructed contact between the solder ball 312 and at least the second metal layer 310.

The semiconductor chip 314, which may be a memory chip, may be connected to the solder ball 312 at a conductive element 316, which may be a through-hole or wrap-around conductor. The solder ball 312 may be a lead-free solder, such as SnAgCu, but any solder known in the art may be substituted. The solder ball 312 may be formed on the semiconductor chip 314 prior to the semiconductor chip 314 and solder ball 312 being positioned as depicted in FIG. 3.

The bond site 322 may be similar to the bond site 100 of FIG. 1, for example. Further, many bond sites 322 may be formed on a packaging substrate to provide multiple bonding sites to a semiconductor chip. The bond site 322 may include a substrate 302, a contact 306, a first metal 308 and a second metal 310. The substrate 302 may provide mechanical support for packaging at least the semiconductor chip 314. Additionally, the substrate 302 may provide for electrical connection between the semiconductor chip 314 and a printed circuit board, for example. The electrical connections may be provided by one or more electrical traces, such as the contact 306, fabricated into the substrate 302, as one skilled in the art would understand. The first and/or second metals 308, 310 may provide a bonding medium for the solder ball and electrical connection between the solder ball 312 and the contact 306. Lastly, the solder mask 304 may provide an insulating cover to portions of the contact 306 that may make inadvertent contact with other areas of the semiconductor chip 314.

The openings and defining sidewalls of the of the bond site 322 may provide for unobstructed electrical contact between the solder ball 312 and the contact 306. The first and second metal layers 308, 310 may provide bond promoting metallic layers for providing electric contact between the solder ball 312 and the contact 306. At least the sidewall 318 and step 320 may provide for a discontinuous opening in a solder mask 304 that allow for the solder ball 312 to make unobstructed contact with the first and second metal layers 308, 310 that are recessed below a top side of the solder mask 304.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. A method, comprising:
   forming a masking layer defined by a discontinuous profile of the masking layer on a substrate including a contact;
   forming a first metal layer on a contact of the substrate; and
   forming a second metal layer on the first metal layer, wherein forming the second metal layer comprises forming a top surface of the second metal layer below a top surface of the masking layer defined by the discontinuous profile.

2. The method of claim 1, wherein forming the masking layer defined by a discontinuous profile on the substrate comprises:
   etching a first opening defined by a first sidewall extending from a top surface of the masking layer to a step; and
   etching a second opening defined by a second sidewall extending from the step and terminating at the contact.

3. The method of claim 2, wherein a "leaky chrome" process is used to etch the first opening and to etch the second opening.

4. The method of claim 2, wherein the first opening has a larger diameter than a diameter of the second opening.

5. The method of claim 4, wherein the first sidewall extends at an angle from the top surface of the masking layer to a first edge of the step, and the second sidewall extends from a second edge of the step to the contact.

6. The method of claim 4, wherein the second opening exposes a portion of the contact.

7. The method of claim 2, wherein the first metal layer is formed in the second opening of the masking layer.

8. The method of claim 1, wherein forming the first metal layer on the contact comprises an electroless plating process, and wherein forming the second metal layer on the first metal layer comprises a gold immersion plating process.

9. The method of claim 1, wherein the discontinuous profile is characterized by an angled first sidewall extending from a top surface of the masking layer to an outer edge of a step, and a second sidewall extending from an inner edge of the step toward the contact, wherein the first sidewall is set back from the second sidewall.

10. The method of claim 1, further comprising:
    forming the contact on the substrate; and
    etching the contact into a pedestal shape on the substrate.

11. A method, comprising:
    forming a solder mask layer on a contact of a substrate;
    etching from a top surface of the solder mask layer to a step of the solder mask layer to form a first profile of the solder mask layer;
    etching from the step of the solder mask layer to a top surface of the contact to form a second profile of the solder mask layer;
    forming a first metal layer on a contact of the substrate, a portion of the first metal layer formed above the step of the solder mask layer; and
    forming a second metal layer on the first metal layer, wherein forming the second metal layer on the first metal layer comprises forming a top surface of the second metal layer below the top surface of the solder mask layer.

12. The method of claim 11, wherein forming the first metal layer on the contact of the substrate comprises forming the first metal layer in an area defined by the second profile of the solder mask layer.

13. The method of claim 12, wherein the area defined by the second profile of the solder mask layer includes two sidewalls of the solder mask layer extending perpendicularly from the step of the solder mask layer to the contact.

14. The method of claim 11, wherein forming the second metal layer on the first metal layer comprises forming a portion of the second metal layer above the step of the solder mask layer.

15. The method of claim 11, wherein forming the second metal layer on the first metal layer comprises forming the second metal layer in an area partially defined by the first profile of the solder mask layer.

16. The method of claim 11, wherein forming the second metal layer on the first metal layer comprises forming a portion of the second metal layer on the step of the solder mask layer.

17. The method of claim 11, wherein the step of the solder mask layer is between the top surface of the solder mask layer and a top surface of the contact.

18. The method of claim 11, wherein a portion of the solder mask layer is formed on the substrate.

19. The method of claim 18, wherein the portion of the solder mask layer formed on the substrate is defined by a pedestal shape of the contact on the substrate.

20. The method of claim 11, wherein the first metal layer is formed from nickel and the second metal layer is formed from gold.

* * * * *